United States Patent [19]

Wu et al.

[11] Patent Number: 5,777,368

[45] Date of Patent: Jul. 7, 1998

[54] ELECTROSTATIC DISCHARGE PROTECTION DEVICE AND ITS METHOD OF FABRICATION

[75] Inventors: Chau-Neng Wu, Kaoshiung Hsien; Ta-Lee Yu, Hsinchu Hsien; Alex Wang, Hsinchu, all of Taiwan

[73] Assignee: Winbond Electronics Corp., Taiwan

[21] Appl. No.: 648,225

[22] Filed: May 13, 1996

[51] Int. Cl.$^6$ .............................. H01L 23/62; H01L 29/41
[52] U.S. Cl. ........................ 257/360; 257/356; 257/361; 257/362
[58] Field of Search ........................... 257/356, 360, 257/361, 345, 355, 285, 362

[56] References Cited

U.S. PATENT DOCUMENTS

| | | | |
|---|---|---|---|
| 5,027,252 | 6/1991 | Yamamura | 257/360 |
| 5,293,057 | 3/1994 | Ho et al. | 257/362 |
| 5,502,317 | 3/1996 | Duvvury | 257/360 |
| 5,576,557 | 11/1996 | Kerr et al. | 257/362 |

*Primary Examiner*—Jerome Jackson
*Attorney, Agent, or Firm*—Fish & Richardson P.C.

[57] ABSTRACT

An electrostatic discharge (ESD) protection device includes a drain region and a source region, each having a heavily-doped region and a lightly-doped region, wherein the junction depth of the lightly-doped region is deeper than that of the heavily doped region. Accordingly, the ESD current density will be decreased owing to the enlarged junction area during the ESD event. In addition, the heat dissipation can be spread over the enlarged junction area instead of being focused on the drain cylindrical edge. Moreover, low parasitic capacitance in the bond pad is achieved because the junction capacitance of the lightly-doped region is smaller than that of the heavily-doped region. Furthermore, conducting blocks are arranged between the lightly-doped regions and the source/drain electrodes, respectively, to prevent the metal melt filament from spiking the junction.

10 Claims, 7 Drawing Sheets

ELECTROSTATIC DISCHARGE PROTECTION DEVICE AND ITS METHOD OF FABRICATION

BACKGROUND OF THE INVENTION

1. Field of the Invention

The present invention generally relates to protection techniques for integrated circuits. In particular, the present invention relates to a electrostatic discharge (ESD) protection device and its method of fabrication.

2. Description of the Related Art

Electrostatic discharge, ESD hereafter, is a common phenomenon that occurs during handling of semiconductor IC devices. An electrostatic charge may accumulate for various reasons and cause potentially destructive effects on an IC device. Damage typically can occur during a testing phase of an IC fabrication, during assembly of the IC onto a circuit board, as well as during use of equipment into which the IC has been installed. Damage to a single IC due to poor ESD protection in an electronic device can hamper its designed functions partially, sometimes completely. ESD protection for semiconductor ICs is, therefore, a reliability issue.

ESD stress models are based on the reproduction of typical discharge pulses to which the IC may be exposed during manufacturing or handling. Three standard models, known as the Human Body Model (HBM), Machine Model (MM), and Charged Device Model (CDM) have been developed. The human-body model is set forth in U.S. Military Standard MIL-STD-883, Method 3015.6. This Military Standard models the electrostatic stress produced on an IC device when a human carrying an electrostatic charge touches the lead pins of the IC device. The machine model is set forth in Industry Standard EIAJ-IC-121, which describes the electrostatic stress produced on an IC device when a machine carrying an electrostatic charge contacts the lead pins of the IC device. The charged device model describes the ESD current pulse generated when an IC device already carrying an electrostatic charge is grounded in the process of being handled.

Referring to FIGS. 1A and 1B, circuit diagrams of ESD protection circuits used with an input pad and an output pad are schematically depicted, respectively. As shown in FIG. 1A, an NMOS transistor $M_1$ is utilized to protect an internal circuit 6 against ESD stress that may appear at the input pad 5. Gate, source and bulk of the NMOS transistor $M_1$ are all tied to circuit ground, $V_{SS}$. The drain of the NMOS transistor $M_1$ is connected to the input pad 5. However, as shown in FIG. 1B, an NMOS transistor $M_2$ and a PMOS transistor $M_3$ are employed to protect the internal circuit 6 from ESD damage at the output pad 7. Accordingly, gates of the NMOS and PMOS transistors are both connected to the internal circuit 6, drains of which are tied together to the output pad 7. Moreover, the source and bulk of the NMOS $M_2$ are tied together to circuit ground $V_{SS}$. The source and bulk of the PMOS transistor $M_3$ are tied together to a $V_{DD}$ power rail.

Next, referring to FIG. 2, an ESD protection device fabricated in a semiconductor substrate 1 is schematically depicted in a cross-sectional view. An NMOS transistor, such as the device $M_1$ in FIG. 1A or the device $M_2$ in FIG. 1B, is shown on the left-hand side. For comparison, a PMOS transistor, such as the device $M_3$ in FIG. 1B, is shown on the right-hand side. As is well known in this art, the PMOS or NMOS transistor is fabricated in an N-well or a P-well region (not shown in figure), which is formed in the semiconductor substrate 1. Field oxides 10 and 11 are formed on a predetermined portion of the substrate 1 by a local oxidation of silicon (LOCOS) process, thereby an active region 100 is defined therebetween. Numeral 12 designates a gate oxide layer and numeral 13 designates a gate electrode. A drain region 14A and a source region 14B spaced apart on the opposite sides of the gate electrode 13 are formed by implanting P-type or N-type impurities into the substrate 1. A dielectric layer 15 overlying the overall surface is patterned and etched to form a pair of contact windows 16 and 17 to expose the drain region 14A and source region 14B, respectively. Furthermore, conducting layers 18 and 19 patterned from the same aluminum layer are connected to the drain region 14A and source region 14B via the openings 16 and 17, respectively.

In conventional abrupt junction processes, when the drain junction is stressed commonly to the source region 14B and the substrate 1, the avalanche breakdown will occur at the drain cylindrical edge 110 causing maximum heat generation at this location. The heat dissipated at the junction than leads to thermal breakdown and damage at the drain junction. Further heating results in a metal melt filament formation, with the heat isotropically spreading to the conducting layers 18 and 19, so as to spike the source/drain junctions, or even causes the filament to melt, resulting in a short circuit between the source region 14B and drain region 14A. For the foregoing reasons, there is a need for an ESD protection device to lower the ESD current density as well as spread the heat over a larger area instead of focusing the heat on the drain cylindrical edge.

SUMMARY OF THE INVENTION

Accordingly, the present invention concerns an ESD protection device with enlarged source and drain junction area which provides an enhanced capability against ESD stress so as to decrease the ESD current density.

It is another object of the present invention to provide an ESD protection device with conducting blocks formed above source and drain regions so as to prevent filament melting.

It is further another object of the present invention to provide an ESD protection device having an decreased junction capacitance and pad capacitance.

Moreover, the present invention pertains to a method for fabricating the above-mentioned ESD protection device with a source/drain junction area larger than the conventional one.

Accordingly, the present invention achieves the above objects by providing an electrostatic discharge protection device, comprising:

a semiconductor substrate of a first conductivity type;

a gate structure formed on the substrate;

a source region and a drain region of a second conductivity type formed on opposite sides of the gate structure, each of which is constituted by heavily-doped and lightly-doped regions, wherein the lightly-doped region has a junction depth deeper than the heavily-doped region;

a dielectric layer covering the gate structure, source region and drain region and patterned to form a pair of contact windows to expose the drain region and the source region, respectively; and a first electrode and a second electrode formed on the dielectric layer as well as connected to the drain region and source region via the contact windows, respectively.

Furthermore, the present invention provides a method of fabricating the above-identified ESD protection device, comprising:

(a) providing a semiconductor substrate of a first conductivity type;

(b) forming an oxide layer overlying the substrate, which is patterned and etched to form two openings that expose the substrate;

(c) forming a polysilicon layer overlying the oxide layer which is connected to the substrate via the openings, wherein the polysilicon layer is doped with impurities of a second conductivity type;

(d) driving the impurities into the substrate via the openings to form a pair of lightly-doped regions therein;

(e) patterning and etching the polysilicon layer to form a pair of conducting blocks over the lightly-doped regions and a gate structure therebetween;

(f) implanting ions of the second conductivity type into the substrate, by utilizing the gate structure and conducting blocks as masking, to form heavily-doped regions having a junction depth shallower than that of the lightly-doped regions;

(g) forming a dielectric layer overlying the substrate which is then etched to shape two contact windows exposing the conducting blocks, respectively; and (h) forming two electrodes connected to the conducting blocks, respectively.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein.

DESCRIPTION OF THE PREFERRED EMBODIMENTS

Figure 1A:
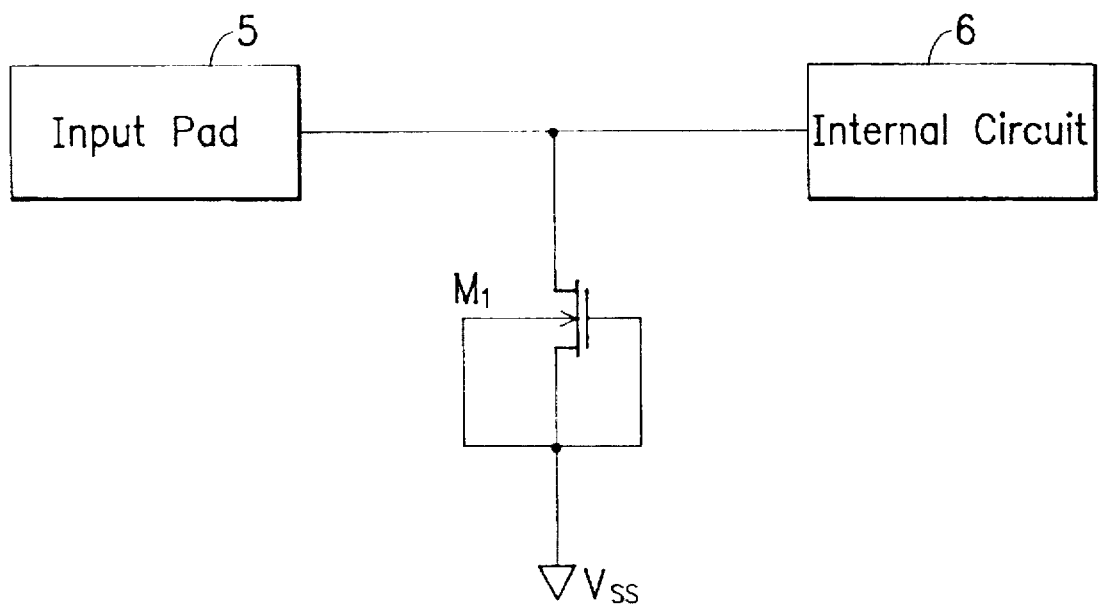
FIGS. 1A and 1B depict circuit diagrams of ESD protection circuits used at an input pad and an output pad, respectively.
Figure 1B:
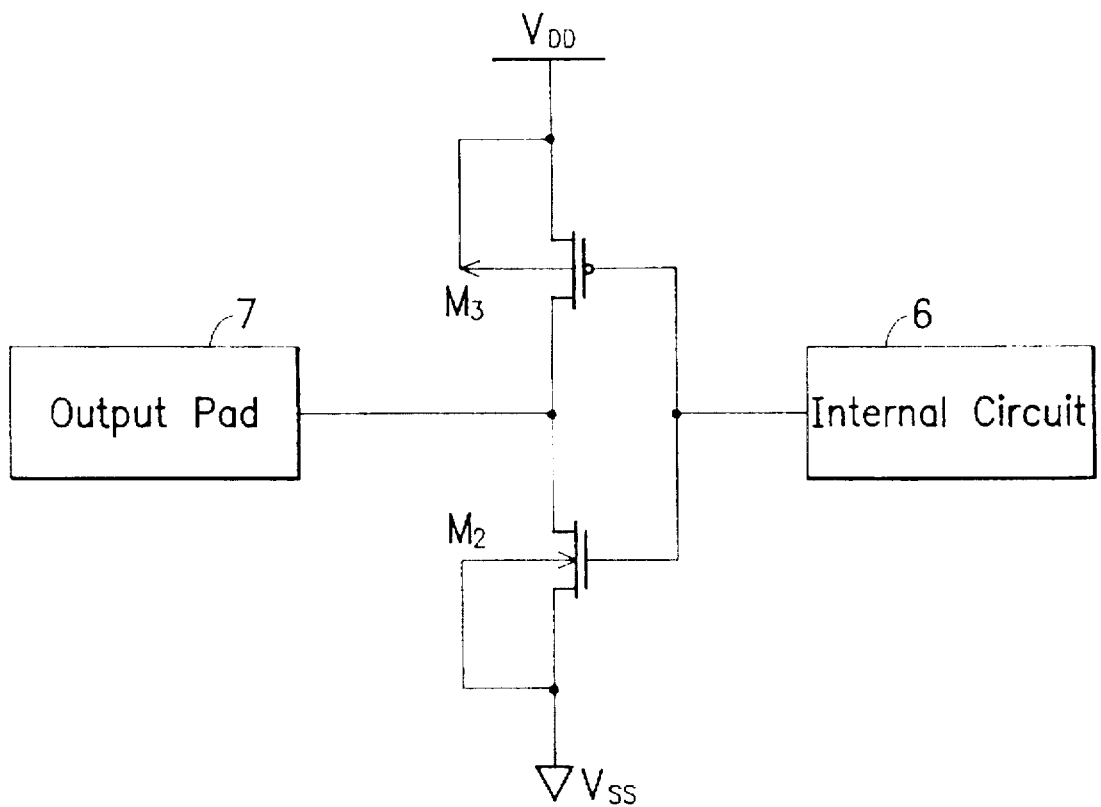
Figure 2:
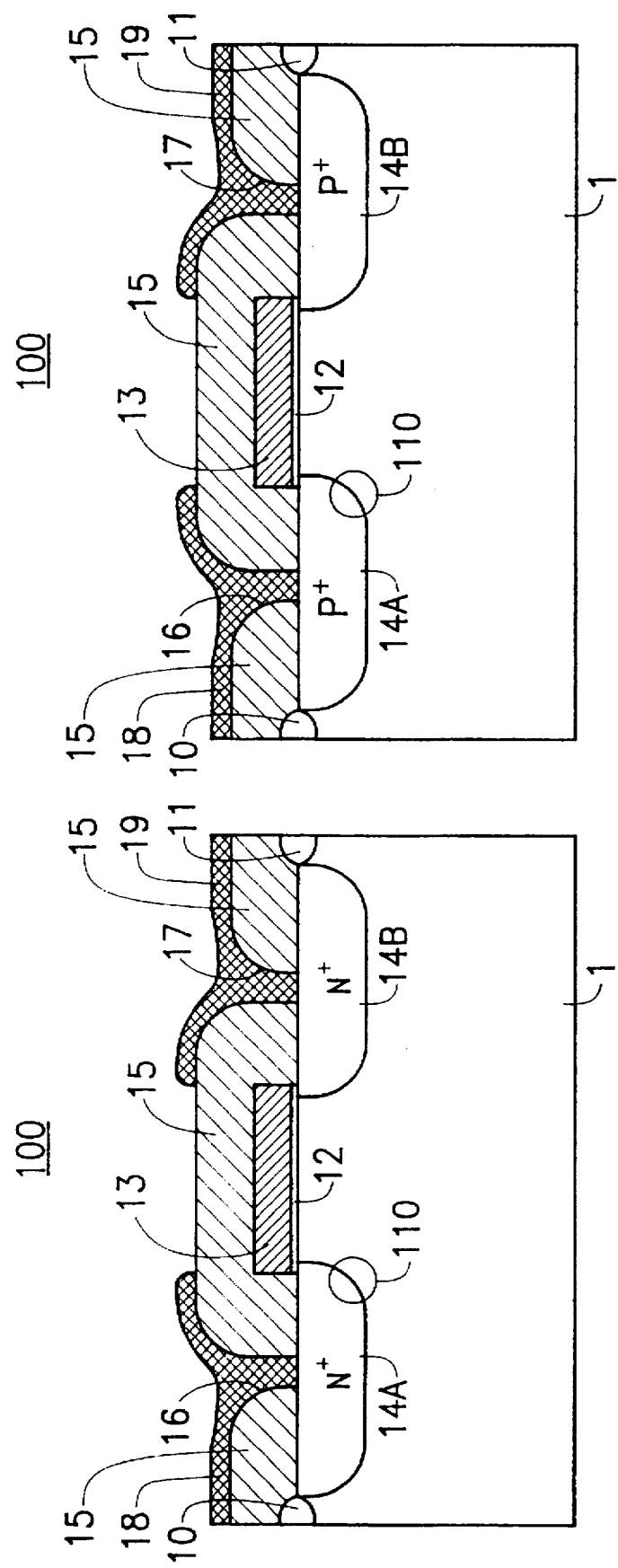
FIG. 2 (PRIOR ART) depicts the cross-sectional view of a conventional ESD protection device formed in a semiconductor substrate.

Referring to FIGS. 3A–3E, the process flow of one preferred embodiment according to the present invention is depicted in cross-sectional views. In the drawings, the fabrication process of an NMOS transistor (e.g., the device $M_1$ in FIG. 1A or the device $M_2$ in FIG. 1B) is depicted on the left-hand side. For comparison, the fabrication process of a PMOS transistor (e.g., the device $M_3$ in FIG. 1B) is depicted on the right-hand side. These drawings merely show several key steps in sequential processes.

Figure 3A:
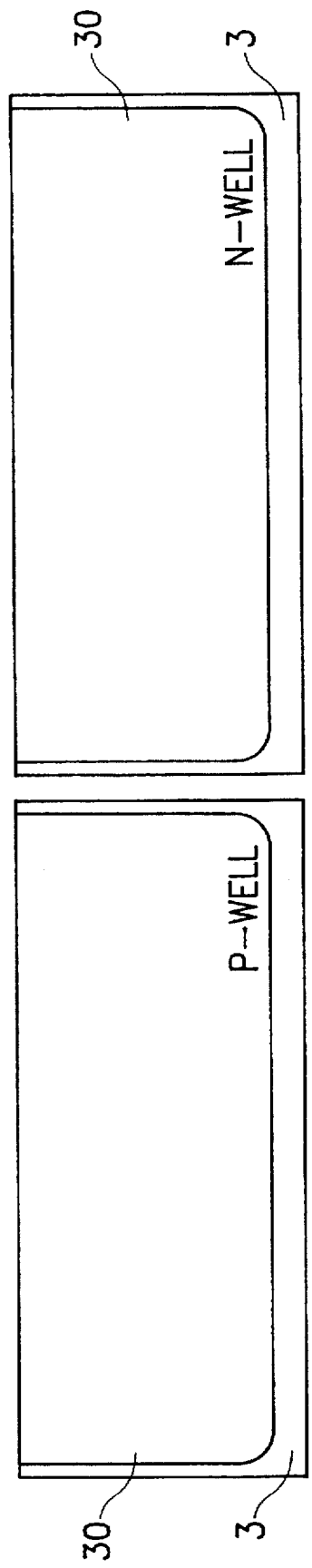
FIGS. 3A–3E depict the process flow of one preferred embodiment according to the present invention in cross-sectional views.

As first shown in FIG. 3A, a semiconductor substrate 3, such as a silicon wafer, is provided. A well region 30 is then formed in the substrate 3 by means of ion implantation. If the fabricated ESD protection device is an NMOS transistor, the well region 30 is a P-well region as exemplified in the drawings. When the fabricated ESD protection device is a PMOS transistor, the well region 30 is an N-well region.

Figure 3B:
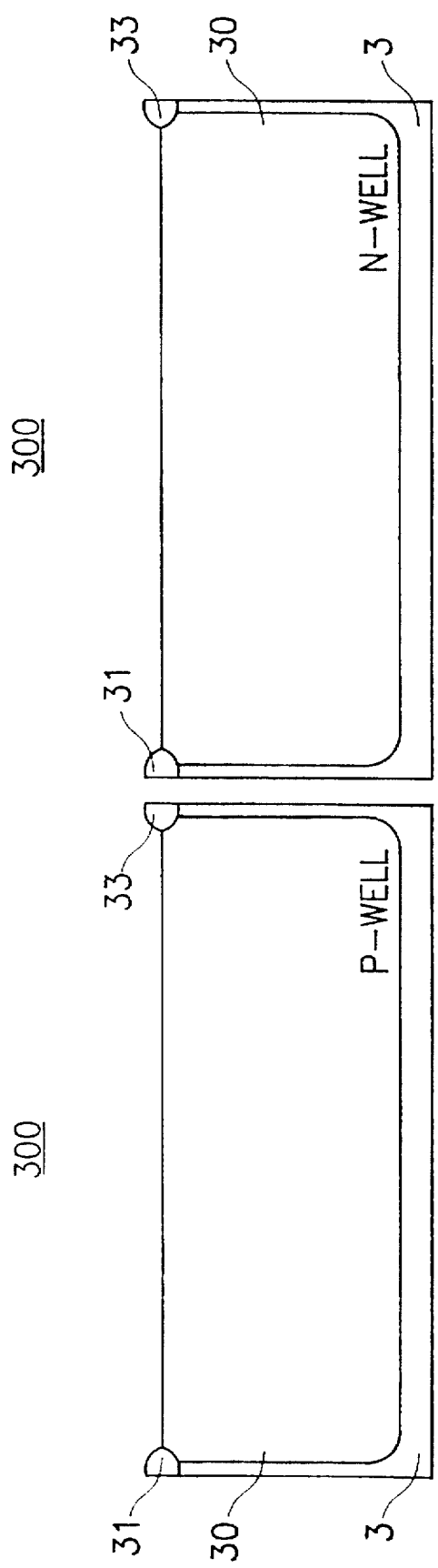

Next, as shown in FIG. 3B, field oxides 31 and 33 are formed on the substrate 3 to define an active region 300 therebetween, and serve as isolating structures with other adjacent devices. Preferably, the field oxides 31 and 33 are formed by a local oxidation of silicon (LOCOS) procedure.

Figure 3C:
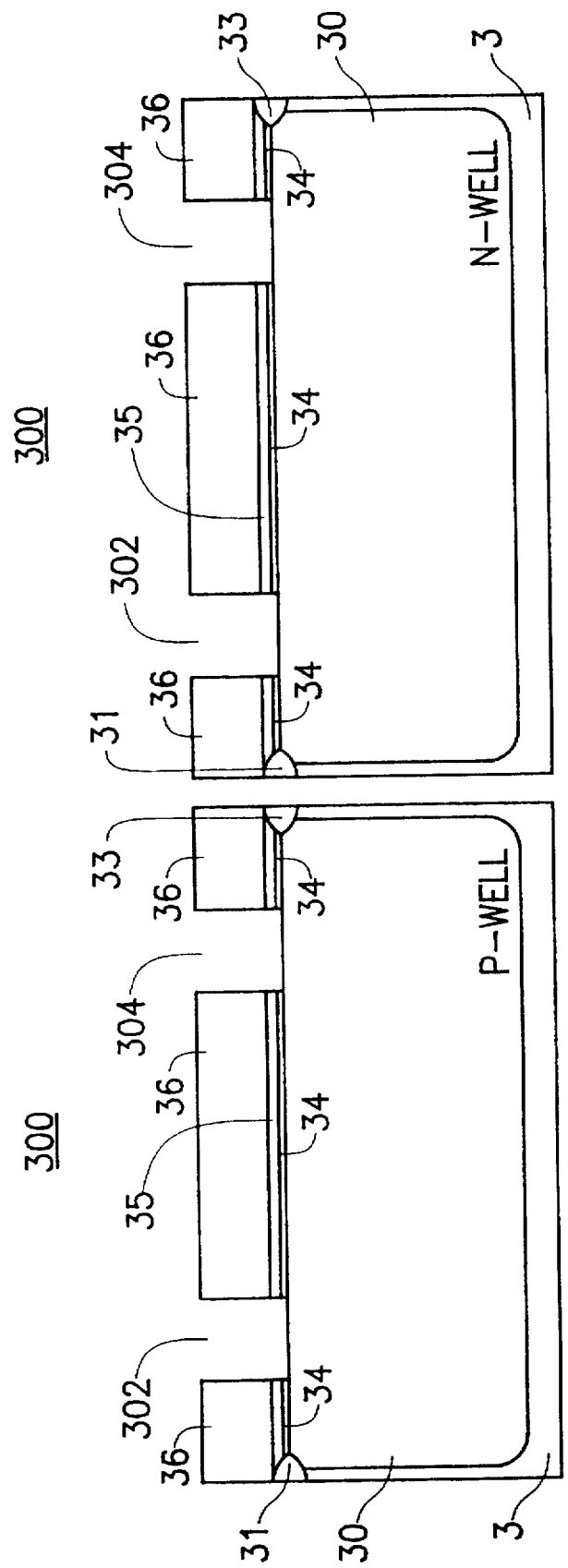

Referring to FIG. 3C, the surface of the well region 30 is then subjected to a thermal oxidation process to form a thin oxide layer 34 overlying the portion not covered by the field oxides 31 and 33. Subsequently, a thin polysilicon layer 35 is formed on the thin oxide layer 34, preferably, in a chemical vapor deposition (CVD) chamber. Then, a first photoresist layer 36 is coated on the overall surface and patterned to form two openings 302 and 304. By utilizing the first photoresist layer 36 as a mask, the thin polysilicon layer 35 and thin oxide layer 34 are subsequently patterned and etched through those openings 302 and 304 to expose the well region 30 as depicted in FIG. 3C. The thin polysilicon layer 35 and thin oxide layer 34 are compatible with the processes applied to the internal circuit. However, the thin layers 34 and 35 are merely used as a diffusion barrier in this embodiment.

Figure 3D:
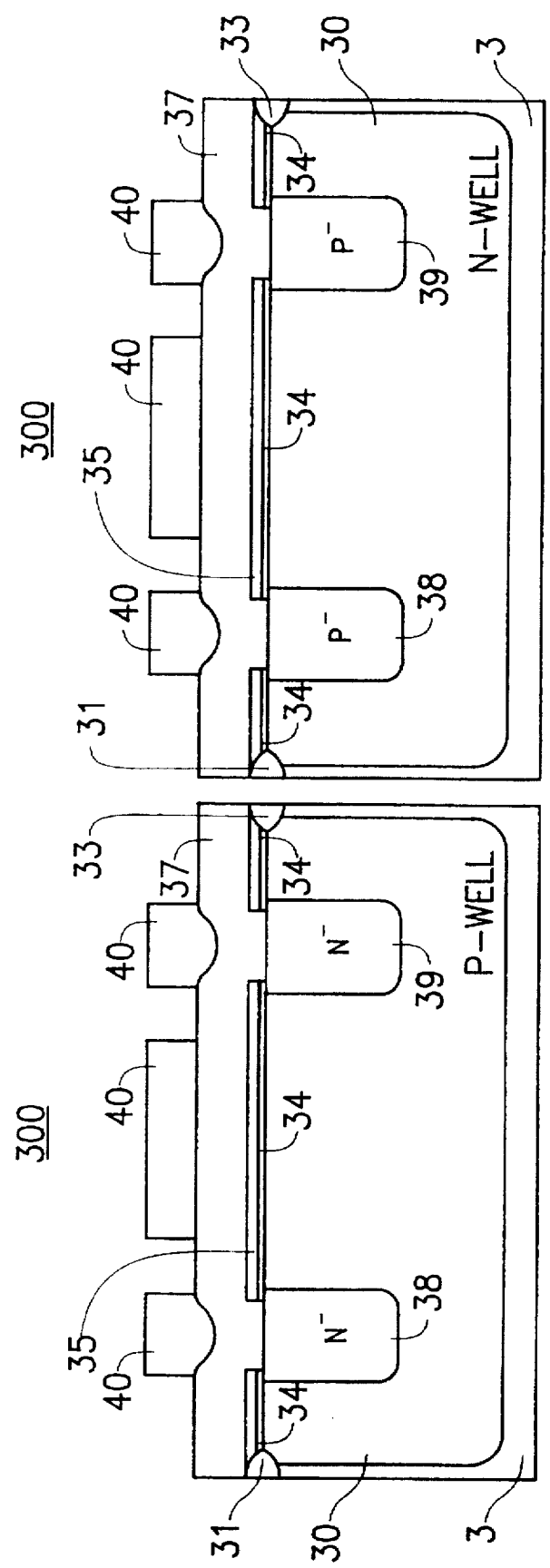

The first photoresist layer 36 is thereafter removed. Referring to FIG. 3D, a polysilicon layer 37 is formed on the overall surface as well as connected to the well region 30 via the openings 302 and 304. The polysilicon layer 37 is implanted with impurities, such as phosphorus-containing ions at an energy of 40–60 KeV and a dosage of about $5 \times 10^{15} - 5 \times 10^{16} \text{cm}^{-2}$ for the NMOS fabrication process, or $BF_2^+$ ions at an energy of about 40–60 KeV and a dosage of about $5 \times 10^{15} - 5 \times 10^{16} \text{cm}^{-2}$ for the PMOS fabrication process. After that, thermal diffusion is conducted to drive those impurities contained in the polysilicon layer 37 into the well region 30 through the openings 302 and 304 to form a pair of lightly-doped regions 38 and 39, respectively. As depicted in FIG. 3D, each of the lightly-doped regions 38 and 39 has a junction depth of about 0.4–0.6 μm and a doping concentration of about $5 \times 10^{17} - 5 \times 10^{18} \text{cm}^{-3}$.

Figure 3E:
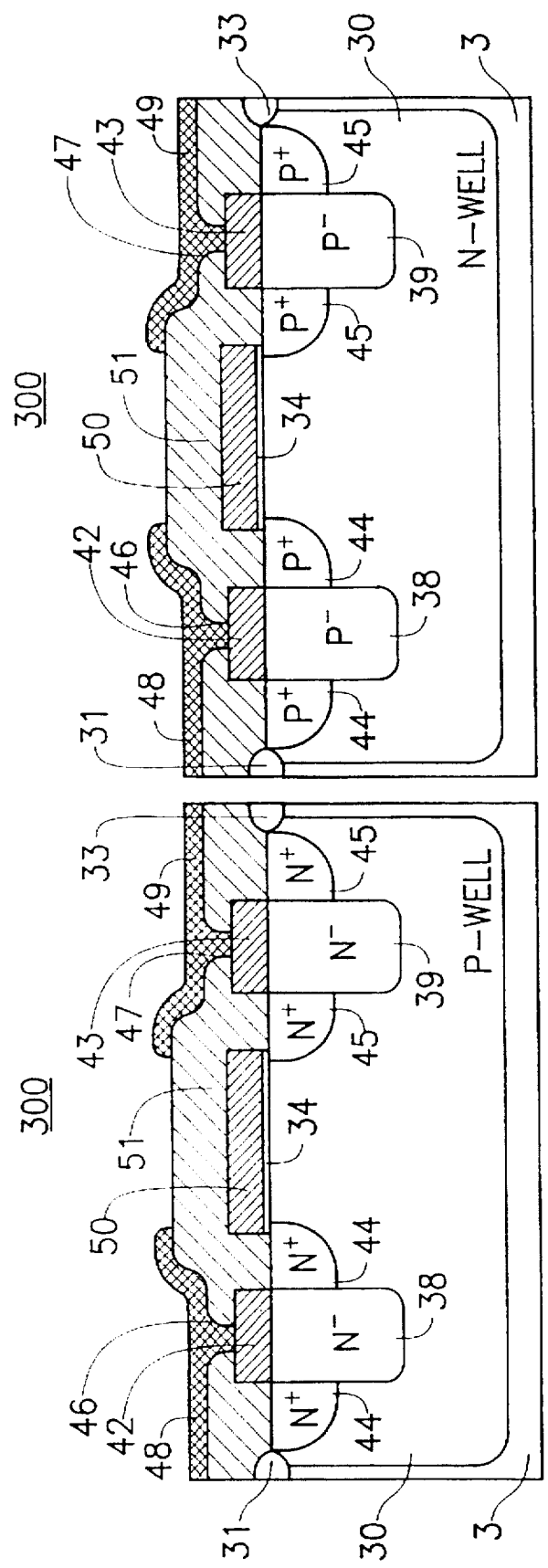

Moreover, a second photoresist layer 40 is coated on the polysilicon layer 37, and then patterned to cover the lightly-doped 38 and 39. Then, the pattern of a gate electrode (depicted in the following figure) is defined. Referring to FIG. 3E, with the second photoresist layer 40 used as masking, the polysilicon layer 37 is patterned and etched to form a gate electrode 50 and a pair of conducting blocks 42,43 spaced apart thereby. Also, the thin polysilicon layer 35 and thin oxide layer 34 are simultaneously removed from the surface to expose the well region 30. By using the gate electrode 50 and conducting blocks 42,43 as masking, impurities are implanted into the well region 30 to form a pair of heavily-doped region 44 and 45, as illustrated in FIG. 3E. For the NMOS fabrication process, the heavily-doped regions 44 and 45 have a junction depth of about 0.1–0.3 μm and a doping concentration of about $5 \times 10^{19} - 5 \times 10^{20} \text{cm}^{-3}$. For the PMOS fabrication process, the heavily-doped regions 44 and 45 have a junction depth of about 0.2–0.4 μm and a doping concentration of about $5 \times 10^{19} - 5 \times 10^{20} \text{cm}^{-3}$. The heavily-doped region 44 and lightly-doped region 38 constitute a drain region of the ESD protection device, and the heavily-doped region 45 and lightly-doped region 39 constitute a source region of the ESD protection device.

A dielectric layer 51 is thereafter deposited to overlie the overall surface. The dielectric layer 51 is patterned and etched to form a pair of contact windows 46 and 47 to expose the conducting blocks 42 and 43, respectively. A metal layer, such as one made of aluminum, is formed on the dielectric layer 51 and connected to the conducting blocks 42 and 43 via the contact windows 46 and 47, respectively. Afterwards, the metal layer is patterned and etched to form a first electrode 48 and a second electrode 49. The first electrode 48 is connected to the first conducting block 42 via the contact window 46. The second electrode 49 is connected to the second conducting block 43 via the contact window 47 as well as to circuit ground $V_{SS}$ or the power rail $V_{DD}$ depending on what the NMOS or PMOS transistor is. FIG. 3E illustrates the structure of the preferred embodiment according to the present invention in cross-sectional view.

In conclusion, each of the drain region and source region in accordance with the present invention, is constituted by a heavily-doped region and a lightly-doped region, wherein the junction depth of the lightly-doped region is deeper than that of the heavily doped region. Accordingly, the ESD current density will be decreased owing to the enlarged junction area during the ESD event. In addition, the heat dissipation can be spread over the enlarged junction area instead of being focused on the drain cylindrical edge. In addition, low parasitic capacitance in the bond pad is achieved since the junction capacitance of the lightly-doped region is smaller than that of the heavily-doped region. Furthermore, conducting blocks are arranged between the lightly-doped regions and the source/drain electrodes, respectively, to prevent the metal melt filament from spiking the junction.

What is claimed is:

1. An electrostatic discharge protection device, comprising:

a semiconductor substrate of a first conductivity type;

a gate structure formed on said substrate;

a source region and a drain region of a second conductivity type formed on opposite sides of said gate structure, each of which is constituted by heavily-doped and lightly-doped regions, wherein said lightly-doped region has a junction depth deeper than said heavily-doped region;

a first conducting block formed directly on said lightly-doped region in said source region and a second conducting block formed directly on said lightly-doped region in said drain region;

a dielectric layer covering said gate structure, source region as well as drain region, and patterned to form a pair of contact windows to expose said first and second conducting blocks respectively; and a first electrode and a second electrode formed on said dielectric layer as well as connected to said first and second conducting blocks via said contact windows, respectively.

2. The device as claimed in claim 1, wherein said first conductivity type is P-type and said second conductivity type is N-type.

3. The device as claimed in claim 2, wherein said lightly-doped region has a junction depth of about 0.4–0.6 µm and a doping concentration of about $5\times10^{17}$–$5\times10^{18}$cm$^{-3}$.

4. The device as claimed in claim 3, wherein said heavily-doped region has a junction depth of about 0.1–0.3 µm and a doping concentration of about $5\times10^{19}$–$5\times10^{20}$cm$^{-3}$.

5. The device as claimed in claim 1, wherein said first conductivity type is N-type and said second conductivity type is P-type.

6. The device as claimed in claim 5, wherein said lightly-doped region has a junction depth of about 0.4–0.6 µm and a doping concentration of about $5\times10^{17}$–$5\times10^{18}$cm$^{-3}$.

7. The device as claimed in claim 6, wherein said heavily-doped region has a junction depth of about 0.2–0.4 µm and a doping concentration of about $5\times10^{19}$–$5\times10^{20}$cm$^{-3}$.

8. The device as claimed in claim 1, wherein said first electrode is connected to an input/output pad.

9. The device as claimed in claim 1, wherein said gate structure comprises, from top to down, a gate electrode and a gate dielectric layer.

10. The device as claimed in claim 9, wherein said gate electrode and second electrode are tied together to a power rail.

* * * * *